(12) United States Patent
Aoki et al.

(10) Patent No.: US 7,569,957 B2
(45) Date of Patent: Aug. 4, 2009

(54) HEATING ELEMENT COOLING STRUCTURE AND DRIVE DEVICE HAVING THE COOLING STRUCTURE

(75) Inventors: Kazuo Aoki, Anjo (JP); Junji Tsuruoka, Anjo (JP); Seiji Yasui, Nagoya (JP); Yasushi Kabata, Sakai (JP)

(73) Assignee: Aisini Aw Co., Ltd., Anjo (JP)

( * ) Notice: Subject to any disclaimer, the term of this patent is extended or adjusted under 35 U.S.C. 154(b) by 83 days.

(21) Appl. No.: 12/005,267

(22) Filed: Dec. 27, 2007

(65) Prior Publication Data
US 2008/0169088 A1 Jul. 17, 2008

(30) Foreign Application Priority Data
Jan. 11, 2007 (JP) .............................. 2007-003816

(51) Int. Cl.
*H02K 1/32* (2006.01)
(52) U.S. Cl. .......................... 310/64; 310/52
(58) Field of Classification Search .................. 310/52, 310/54, 58, 64
See application file for complete search history.

(56) References Cited

U.S. PATENT DOCUMENTS

| 5,585,681 A | * | 12/1996 | Bitsche ......................... 310/54 |
| 6,323,613 B1 | * | 11/2001 | Hara et al. .................. 318/471 |
| 7,102,260 B2 | * | 9/2006 | Takenaka et al. .............. 310/64 |
| 2005/0253465 A1 | | 11/2005 | Takenaka et al. | |

FOREIGN PATENT DOCUMENTS

| JP | A 06-326226 | 11/1994 |
| JP | A-2001-035981 | 2/2001 |
| JP | A 2005-20881 | 1/2005 |
| WO | WO 2004/025807 | 3/2004 |

* cited by examiner

*Primary Examiner*—Nguyen N Hanh
(74) *Attorney, Agent, or Firm*—Oliff & Berridge, PLC

(57) ABSTRACT

A heat generating member cooling structure in which a coolant space is formed between a heat releasing surface that is thermally connected to a heat generating member and an opposing surface that is positioned opposite the heat releasing surface, includes a plurality of heat releasing fins that are provided within the coolant space so as to be parallel to one another and stand from the heat releasing surface toward the opposing surface, and an inter-fin passage, through which a coolant flows, formed between every two of the plurality of heat releasing fins that are positioned adjacent to each other.

20 Claims, 5 Drawing Sheets

HEATING ELEMENT COOLING STRUCTURE AND DRIVE DEVICE HAVING THE COOLING STRUCTURE

INCORPORATION BY REFERENCE

The disclosure of Japanese Patent Application No. 2007-003816 filed on Jan. 11, 2007 including the specification, drawings and abstract is incorporated herein by reference in its entirety.

BACKGROUND

The present invention relates to a heating element cooling structure and a drive device having the cooling structure.

When an electric motor is used as a driving power source of a vehicle, the electric motor requires an inverter for controlling the electric motor and an ECU or the like for controlling the inverter. The inverter and the like are each connected to the electric motor via a power cable. Thus, it is possible to position these elements in appropriate places away from the electric motor. However, for the sake of convenience during the installation of these elements into the vehicle, these elements may be arranged to be integrated with a drive unit that has the electric motor built therein.

The heat resistance temperature of the inverter and the like is currently lower than the heat resistance temperature of the electric motor. Thus, when the inverter and the like are positioned so as to be integrated with the drive unit that has the electric motor built therein, it is necessary to have an arrangement for blocking the heat that is directly transferred from the electric motor to the inverter and the like in order to thermally protect the inverter and the like. In addition, because the temperature of the inverter and the like increases due to their own heat generation, it is necessary to cool down the inverter and the like so that they are kept below their heat resistance temperatures.

To cope with this circumstance, a drive unit that has a cooling structure for cooling down an inverter as well as an electric motor has conventionally been proposed (for example, see International Publication No. WO 2004/025807). In the cooling structure included in the drive unit disclosed in International Publication No. WO 2004/025807, a coolant space is formed between a heat releasing surface that is thermally connected to an inverter and an opposing surface that is positioned opposite the heat releasing surface and is thermally connected to the drive unit case. A plurality of heat releasing fins are provided within the coolant space such that they are positioned parallel to one another and stand from the heat releasing surface on the inverter case side toward the case surface on the drive unit case side. An inter-fin passage through which a coolant flows is formed between every two of the plurality of heat releasing fins that are positioned adjacent to each other. In this type of cooling structure, the coolant that is supplied by a coolant pump into the coolant space flows through the plurality of inter-fin passages that are positioned parallel to one another. With this arrangement, it is possible to cool down the inverter via the heat-releasing surface and also to cool down the electric motor via the opposing surface.

Also, Japanese Patent Application Publication No. JP-A-2001-35981 discloses a cooling structure that is similar to the cooling structure disclosed in International Publication No. WO 2004/025807. In the cooling structure disclosed in Japanese Patent Application Publication No. JP-A-2001-35981, ends of inter-fin passages on one side are connected to one another to allow communication there between by a first header that is substantially as high as heat releasing fins. Ends of inter-fin passages on the other side are connected to one another to allow communication there between by a second header that has the same configuration as the first header. In this cooling structure, coolant that is supplied to the first header is distributed so as to flow through each of the inter-fin passages. The coolant that has flowed out of the inter-fin passages meets at the second header.

SUMMARY

In such a heat generating member cooling structure that is used for cooling a heat generating member like an inverter (as described above), it is desirable to have the coolant flow through the inter-fin passages in a uniform manner so that the heat generating member is cooled down without fail.

However, in the heat generating member cooling structure described above, when the coolant is distributed into the inter-fin passages from the first header, sometimes a situation arises where it is not possible to distribute the coolant into the inter-fin passages in a uniform manner because, for example, a large amount of coolant flows through an inter-fin passage that is positioned closer to the place where the coolant is supplied to the first header, whereas not a very large amount of coolant flows through an inter-fin passage that is positioned farther from the place where the coolant is supplied to the first header. In this situation, for each of the inter-fin passages, the amount of coolant that flows through the passage varies. As a result, a problem arises where there is a possibility that the cooling structure may not be able to achieve a high level of cooling performance.

In view of the problem described above, a heat generating member cooling structure that has a high level of cooling performance is provided and a drive unit that includes such a heat generating member cooling structure and thereby achieves high reliability is realized. In addition, various other structures are provided and various other advantages can be achieved.

According to an exemplary aspect of the invention, a heat generating member cooling structure in which a coolant space is formed between a heat releasing surface that is thermally connected to a heat generating member and an opposing surface that is positioned opposite the heat releasing surface, includes a plurality of heat releasing fins that are provided within the coolant space so as to be parallel to one another and stand from the heat releasing surface toward the opposing surface, and an inter-fin passage, through which a coolant flows, formed between every two of the plurality of heat releasing fins that are positioned adjacent to each other. The heat generating member cooling structure comprises an inflow-side coolant reservoir that extends in a direction in which inter-fin passages are arranged in a row with the inflow-side coolant reservoir connected to ends of the inter-fin passages on a first side so as to allow communication there between. The inter-fin passages and the inflow-side coolant reservoir are joined together so as to allow communication there between by a narrowed portion that extends at least throughout an area in which the inter-fin passages are arranged in the row. The narrowed portion has a flowing resistance that is larger than a flowing resistance in the inflow-side coolant reservoir.

BRIEF DESCRIPTION OF THE DRAWINGS

Various exemplary aspects of the invention will be described with reference to the drawings, wherein.

DETAILED DESCRIPTION OF EMBODIMENTS

Embodiments of a heat generating member cooling structure and a drive unit that includes the heat generating member cooling structure according to the present invention will be explained, with reference to the drawings.

Figure 2:
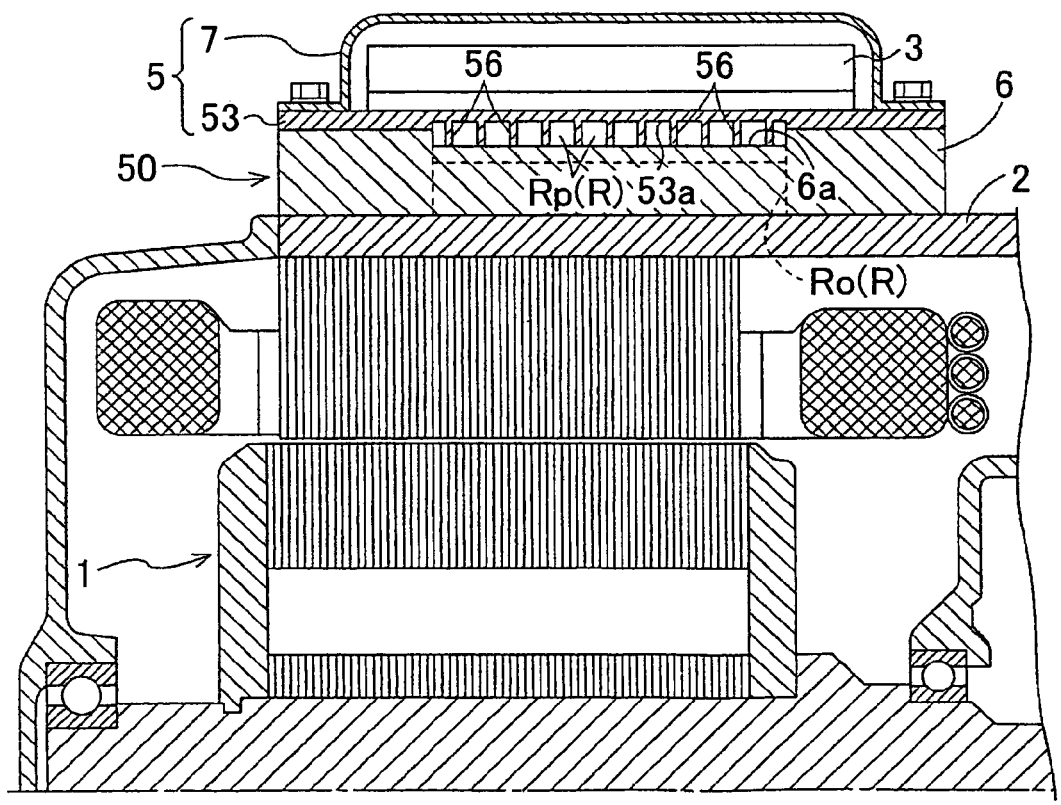
FIG. 2 is a cross-sectional view of a schematic configuration of a drive unit that includes the heat generating member cooling structure.

As shown in FIG. 2, a drive unit according to the present invention (hereinafter, referred to as "the drive unit") includes an electric motor 1, a drive unit case 2 that houses the electric motor 1 therein, and an inverter 3 that controls the electric motor 1. The drive unit employs a heat generating member cooling structure 50 according to the present invention (hereinafter, referred to as "the cooling structure 50").

The drive unit can serve as a drive unit used in an electric automobile, a hybrid vehicle, or the like. The drive unit case 2 houses therein one or both of a motor and a generator that serve as the electric motor 1 as well as auxiliary mechanisms such as a differential device and a counter gear mechanism.

Figure 1:
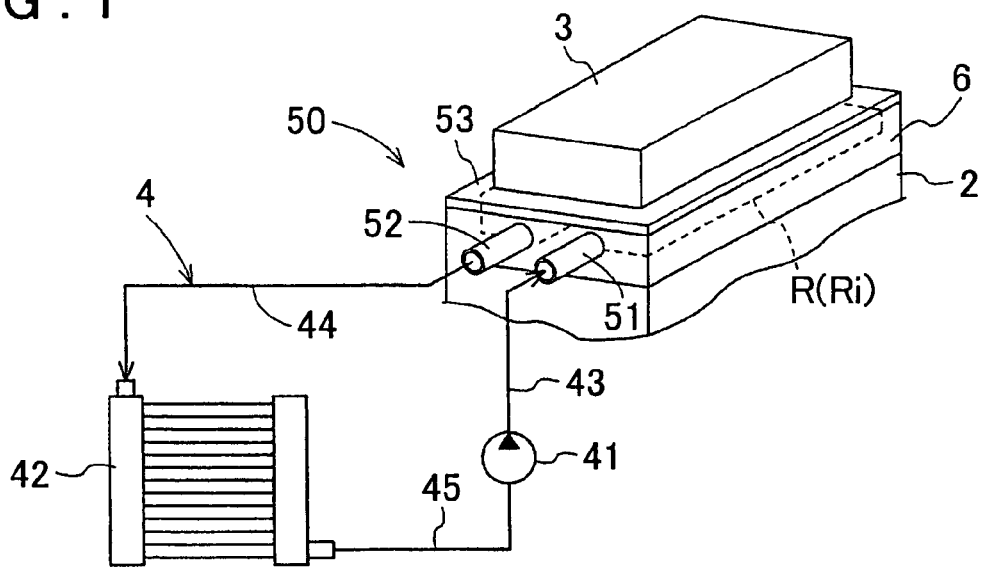
FIG. 1 is a drawing that shows the state of a coolant circulation path in a heat generating member cooling structure.

The detailed configuration of the cooling structure 50 will be explained later. As shown in FIG. 1, the cooling structure 50 is configured so that the heat generated by the heat generating members such as the inverter 3 and the electric motor 1 is released into coolant that circulates in a coolant circulation path 4 to and from a radiator 42 and thereby thermally protects the heat generating members.

The inverter 3 denotes a power module that includes a switching transistor, auxiliary circuit elements, and a circuit substrate that has the switching transistor and the circuit elements provided thereon. By using a switching operation, the switching transistor converts a direct current from a battery power source into an alternating current (a three-phase alternating current, if the electric motor is a three-phase alternating-current electric motor).

The inverter 3 is disposed on the upper face side of a heat sink 53 that is integrally provided with the substrate of the inverter 3 by being attached to the substrate itself or via another member attached to the substrate. The heat sink 53 is fixed to the bottom portion of an inverter case 7 that houses the inverter 3 therein. The lower face of the heat sink 53 serves as a heat releasing surface 53a that is thermally connected to the inverter 3.

The inverter case 7 is configured to cover and protect the inverter 3 from rainwater or dust, while the inverter 3 is housed therein.

The electric motor 1 is housed in the drive unit case 2. A spacer 6 is provided on the upper face of the drive unit case 2. The spacer 6 has, on the upper face thereof, an opposing surface 6a that is positioned opposite the heat releasing surface 53a and is also thermally connected to the electric motor 1.

To be more specific, a rectangular recessed portion is formed on the upper face of the spacer 6, so that a coolant space R (which is explained later) is formed between the spacer 6 and the lower face of the heat sink 53 (i.e., the heat releasing surface 53a) while the heat sink 53 is installed on top of the spacer 6. The bottom face of the recessed portion serves as the opposing surface 6a.

Figure 3:
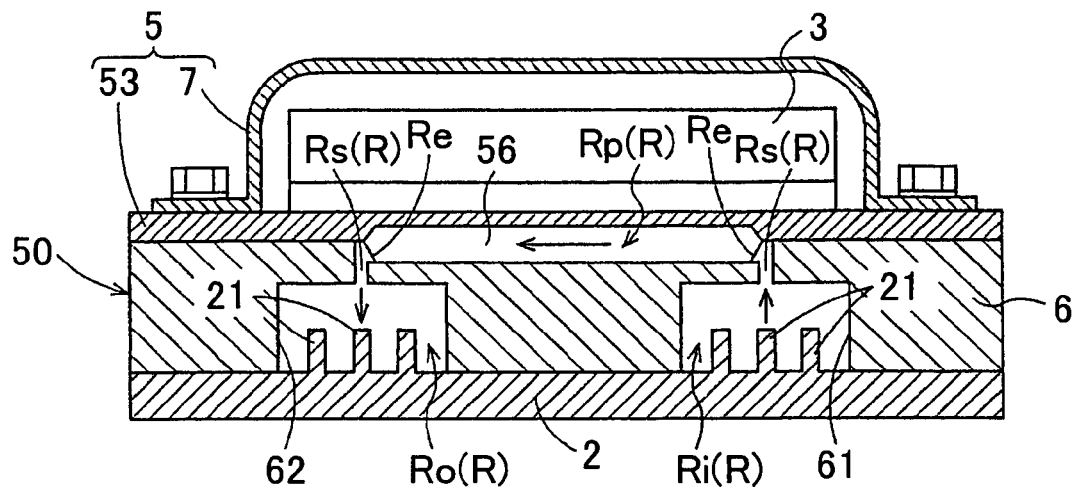
FIG. 3 is a cross-sectional view that shows the state of a coolant space.
Figure 4:
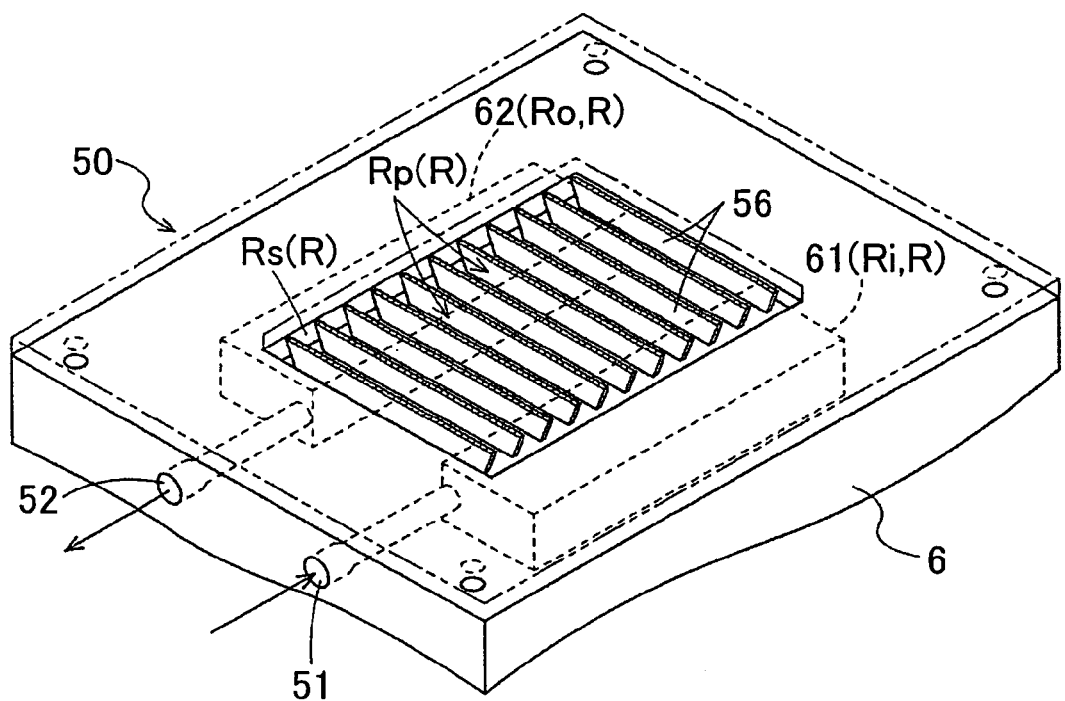
FIG. 4 is a perspective view that shows the state of the coolant space.

Also, as shown in FIGS. 3 and 4, a recessed portion 61 and a recessed portion 62 are formed, so as to be positioned parallel to each other, on the lower face of the spacer 6 (i.e., on the face that is positioned opposite the drive unit case 2). In collaboration with the upper face of the drive unit case 2, the recessed portion 61 forms an inflow-side coolant reservoir Ri, whereas the recessed portion 62 forms an outflow-side coolant reservoir Ro.

In the present application, when it says "the heat releasing surface 53a and the opposing surface 6a are thermally connected to the inverter 3 and the electric motor 1, respectively", it means that the heat generated by the inverter 3 and the electric motor 1 is transferred, either directly or indirectly, to the heat releasing surface 53a and the opposing surface 6a, respectively.

As shown in FIG. 2, in the cooling structure 50, the coolant space R is formed between the heat releasing surface 53a of the heat sink 53 and the opposing surface 6a of the spacer 6, and a plurality of heat releasing fins 56 are provided within the coolant space R such that they are positioned parallel to one another and stand from the heat releasing surface 53a toward the opposing surface 6a, and an inter-fin passage Rp through which the coolant flows is formed between every two of the plurality of heat releasing fins 56 that are positioned adjacent to each other.

To ensure that there is sufficient area for the heat exchange, each of the plurality of heat releasing fins 56 is arranged so as to extend into the coolant space R from the heat releasing surface 53a on the heat sink 53 side toward the opposing surface 6a of the spacer 6, so as to traverse the coolant space R in the thickness direction thereof.

The heat releasing fins 56 are formed by cutting and raising the lower face of the heat sink 53. Thus, the heat releasing surface 53a is positioned close to the inverter 3 side. On the other hand, when the heat releasing fins 56 are formed to stand, in the portions that are formed to stand on the plane from which the heat releasing fins are raised, the length of the edge portion of each of the heat releasing fins 56 is shorter than the length of the base end portion (in the left-to-right direction in FIG. 3) as shown in FIG. 3. The end face Re (i.e., the end face that is positioned close to a narrowed portion Rs) of each of the inter-fin passages Rp is inclined with respect to the direction in which the heat releasing fins 56 stand.

Further, as shown in FIGS. 3 and 4, an inflow-side coolant reservoir Ri is formed by the recessed portion 61 of the spacer 6 and the upper face of the drive unit case 2 so as to extend in the direction in which the inter-fin passages Rp are arranged in a row. In other words, the inter-fin passages Rp extend in a direction that is substantially perpendicular to a direction in which the inflow-side coolant reservoir Ri extends An outflow-side coolant reservoir Ro is formed by the recessed portion 62 of the spacer 6 and the upper face of the drive unit case 2 so as to extend in the direction in which the inter-fin passages Rp are arranged in a row.

Figure 6:
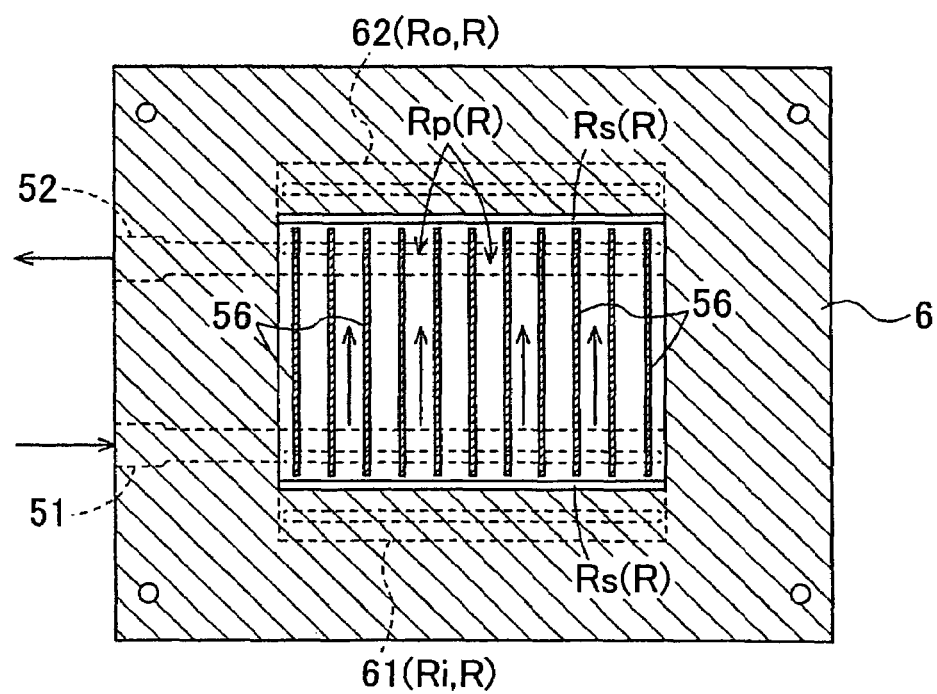
FIG. 6 is a cross-sectional view that shows the state of inter-fin passages.

Also, as shown in FIGS. 3 and 6, the inflow-side coolant reservoir Ri and the ends of the inter-fin passages Rp on one side are joined together so as to allow communication there between by the narrowed portion Rs that is provided so as to extend throughout the area in which the inter-fin passages Rp are arranged in a row. The outflow-side coolant reservoir Ro and the ends of the inter-fin passages Rp on the other side are joined together so as to allow communication there between by the narrowed portion Rs that is provided so as to extend throughout the area in which the inter-fin passages Rp are arranged in a row.

In this situation, the size and the shapes of the inflow-side coolant reservoir Ri, the outflow-side coolant reservoir Ro, and the narrowed portions Rs are arranged so that the flowing resistance at each of the narrowed portions Rs is larger than the flowing resistance at the inflow-side coolant reservoir Ri and the outflow-side coolant reservoir Ro. Each of the narrowed portions Rs is formed so as to have substantially the same width throughout the entire area in which the narrowed portion Rs extends (i.e., along the length).

For example, it is possible to arrange the flowing resistance at each of the narrowed portions Rs to be larger than the flowing resistance at the inflow-side coolant reservoir Ri and the outflow-side coolant reservoir Ro by using the following configurations: the length of the area in which the inter-fin passages Rp are arranged in the row: 70 millimeters; the length of each of the inter-fin passages Rp in the extending direction: 200 millimeters; the total flowing area of the inter-fin passages Rp that are arranged in a row: 1000 square millimeters (when the area of the heat releasing fins is excluded); the capacity of the inflow-side coolant reservoir Ri and the outflow-side coolant reservoir Ro: 1.0 liter each; the length of the inflow-side coolant reservoir Ri and the outflow-side coolant reservoir Ro in the extending direction: 200 millimeters each; the flowing area of the inflow-side coolant reservoir Ri and the outflow-side coolant reservoir Ro: 400 square millimeters each; and the flowing area of the narrowed portions Rs: 500 square millimeters each. These values are mere examples, and the present invention is not limited to these examples.

Further, as shown in FIGS. 3 and 4, the inflow-side coolant reservoir Ri and the outflow-side coolant reservoir Ro are positioned below the area in which the inter-fin passages Rp are formed. The narrowed portions Rs are provided so as to extend above the upper faces (the faces that are positioned opposite the drive unit case 2) of the reservoirs Ro and Ri, so as to connect the reservoirs Ro and Ri and the inter-fin passages Rp together in such a manner that the communication there between is allowed.

A sealing member (not shown in the drawing) that hermetically seals the inflow-side coolant reservoir Ri and the outflow-side coolant reservoir Ro is provided, as necessary, between the upper face of the drive unit case 2 and the lower face of the spacer 6. Also, another sealing member (not shown in the drawing) that hermetically seals the coolant space R from the outside thereof is provided, as necessary, between the lower face of the spacer 6 and the lower face of the inverter case 5.

In addition, as shown in FIGS. 1 and 4, an inflow-side port 51 and an outflow-side port 52 are connected to a lateral end portion on one side of the spacer 6 while being positioned parallel to each other. The inflow-side port 51 is configured so as to allow the coolant to flow into the inflow-side coolant reservoir Ri, whereas the outflow-side port 52 is configured so as to allow the coolant to flow out of the outflow-side coolant reservoir Ro.

Further, as shown in FIGS. 3 and 6, the inverter 3 is cooled down via the heat releasing surface 53a because the coolant that has been supplied to the inflow-side coolant reservoir Ri by a coolant pump 41 provided on the coolant circulation path (which is explained later) flows, via the narrowed portion Rs, through the plurality of inter-fin passages Rp that are positioned parallel to one another. After cooling down the inverter 3, the coolant flows out into the outflow-side coolant reservoir Ro via the narrowed portion Rs.

With the arrangements described above, the coolant that has flowed into the inflow-side coolant reservoir Ri flows into the inter-fin passages Rp in a substantially uniform manner through the entire area of the narrowed portion Rs and flows out of the inter-fin passages Rp in a substantially uniform manner.

Further, as explained above, because the narrowed portion Rs is provided so as to extend above the inflow-side coolant reservoir Ri, the coolant flows into the inter-fin passages Rp after the entire space of the inflow-side coolant reservoir Ri is filled with the coolant. As a result, it is possible to make the flowing amount of coolant uniform in the direction in which the narrowed portion extends. Consequently, it is also possible to have the coolant flow through the inter-fin passages Rp in a uniform manner. In addition, because the outflow-side coolant reservoir Ro is positioned below the narrowed portion Rs, it is possible to prevent the coolant from flowing in the reverse direction.

Further, as shown in FIG. 3, the upper face of the drive unit case 2 forms a part of the inflow-side coolant reservoir Ri and a part of the outflow-side coolant reservoir Ro. Thus, the electric motor 1 is cooled down, via the drive unit case 2, by the coolant that has flowed into the inflow-side coolant reservoir Ro and the coolant that has flowed out of the inter-fin passages Rp into the outflow-side coolant reservoir Ro. In other words, the inflow-side coolant reservoir Ri and the outflow-side coolant reservoir Ro function as a cooling unit for the electric motor 1.

Figure 5:
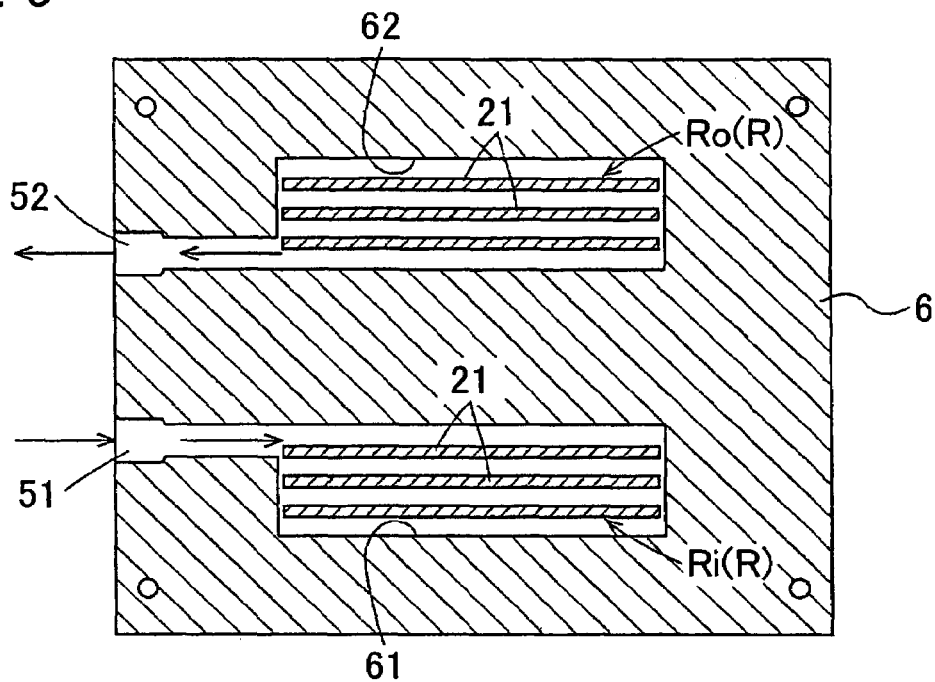
FIG. 5 is a cross-sectional view that shows the state of coolant reservoirs.

Also, as shown in FIGS. 3 and 5, fins 21 are provided in positions of the drive unit case that are opposite the recessed portions 61 and 62, in such a manner that the fins 21 stand toward the inflow-side coolant reservoir Ri and the outflow-side coolant reservoir Ro. With this arrangement, the heat transfer area is increased.

In addition, the coolant space R and the electric motor 1 are thermally connected to each other via the opposing surface 6a and the spacer 6. Thus, the electric motor 1 is also cooled down by the coolant that flows through the inter-fin passages Rp.

Further, as shown in FIG. 6, the inflow-side port 51 and the narrowed portion Rs are positioned in such a manner that, in a plan view to see from the heat releasing surface 53a toward the opposing surface 6a, the direction in which the coolant flows from the inflow-side port 51 into the inflow-side coolant reservoir Ri does not overlap the direction in which the coolant flows out of the inflow-side coolant reservoir Ri into the narrowed portion Rs. In other words, the opening of the inflow-side port 51 and the opening of the narrowed portion Rs are arranged so as not to oppose each other. Similarly, the positional relationship between the outflow-side port 52 and the narrowed portion Rs is arranged in the same manner.

With the arrangement in which the inflow-side port 51 and the narrowed portion Rs are positioned as described above, the coolant that has flowed into the inflow-side port 51 is prevented from flowing only into a part of the narrowed portion Rs. Thus, it is possible to further make uniform the amount of coolant that flows through the inter-fin passages Rp.

Next, the coolant circulation path 4 to which the coolant space R is connected will be explained further in detail, with reference to FIG. 1.

The coolant circulation path 4 is used for having one type of coolant circulate via the coolant space R that is provided between the heat sink 53 and the drive unit case 2. The coolant circulation path 4 is made up of the coolant pump 41 that serve as a pump pressure source, a radiator 42 that serves as a heat exchanger, and flow paths 43, 44, and 45 that connect these elements to one another.

The auxiliary equipment for the coolant pump 41 such as a driving motor is omitted from the drawing. An outlet side flow path 43 of the coolant pump 41 that serves as a starting point of the coolant circulation path 4 is connected to the inflow-side port 51 on the entrance side of the coolant space R. The outflow-side port 52 on the exit side of the coolant space R is connected to the entrance side of the radiator 42 via a returning flow path 44. The exit side of the radiator 42 is connected to an inlet side flow path 45 of the coolant pump 41. Thus, in the coolant circulation path 4, the coolant such as cooling water is pumped out by the coolant pump 41, and then is heated while flowing through the inter-fin passages Rp formed within the coolant space R and absorbing the heat from the module included in the inverter 3 and the heat from the drive unit case 2. After that, the coolant is put into the radiator 42 via the returning flow path 44 and is cooled down when the heat is released into the air. Subsequently, the coolant is returned to the coolant pump 41, and thus completes one cycle of circulation. The coolant repeats this circulation.

It is acceptable to have another arrangement in which, for example, a section of the coolant circulation path 4 corresponding to the returning flow path 44 serves as a flow path that goes through the drive unit case 2 for further cooling.

Other Embodiments (1) In the embodiment described above, the example is explained in which, in a plan view from the heat-releasing surface toward the opposing surface, the portion in which the inter-fin passages Rp are formed partially overlaps the inflow-side coolant reservoir Ri and the outflow-side coolant reservoir Ro. However, the positional relationship between the portions in which the inter-fin passages Rp is formed and the inflow-side coolant reservoir Ri and the outflow-side coolant reservoir Ro is not limited to the example described above. It is acceptable to modify the positional relationship as necessary.

Figure 7:
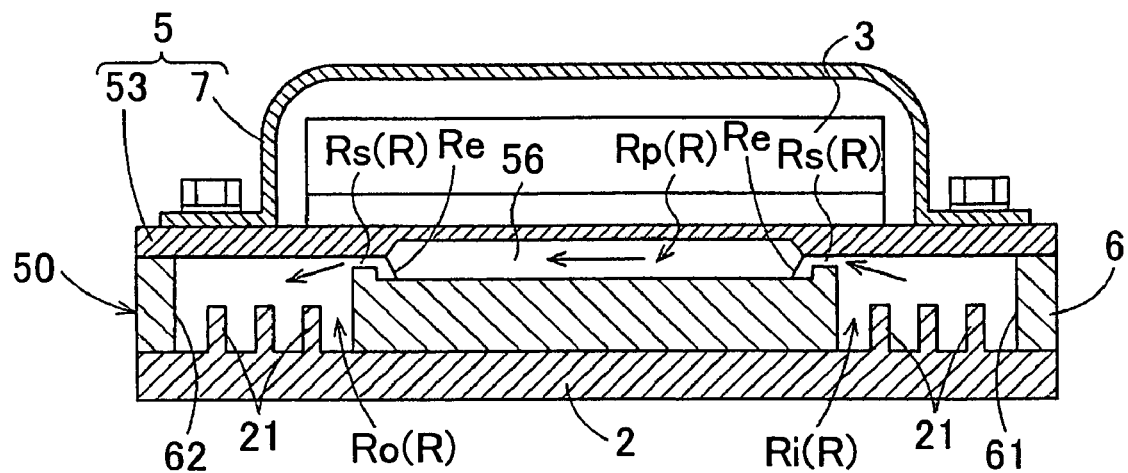
FIG. 7 is a cross-sectional view that shows the state of a coolant space according to another embodiment.

For example, as shown in FIG. 7, it is acceptable to have an arrangement in which the inflow-side coolant reservoir Ri and the outflow-side coolant reservoir Ro are positioned on a plane that is the same as the plane on which the portion in which the inter-fin passages Rp are formed is positioned. By positioning the inflow-side coolant reservoir Ri and the outflow-side coolant reservoir Ro in this manner, it is possible to provide the cooling structure 50 that has a compact configuration in the height direction thereof.

Figure 8:
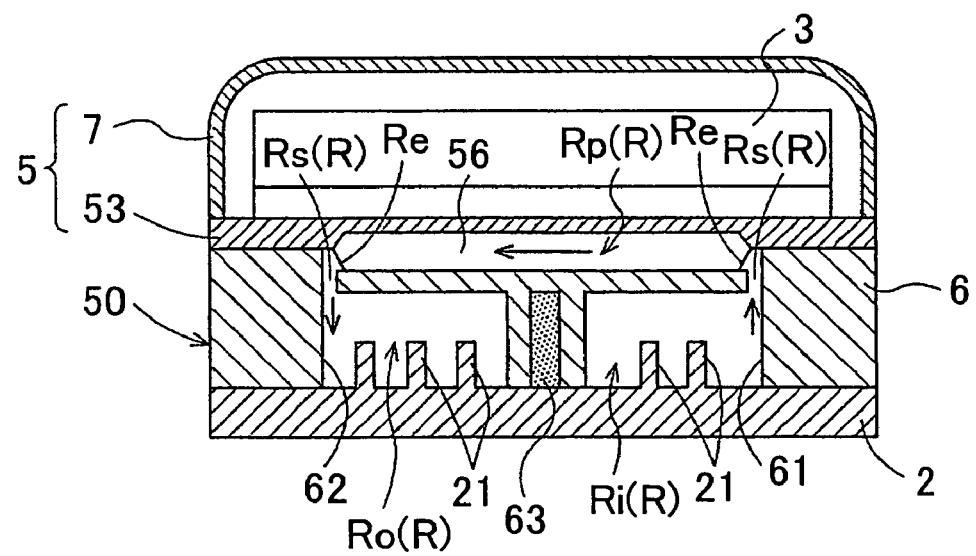
FIG. 8 is a cross-sectional view that shows the state of a coolant space according to yet another embodiment.

As another example, as shown in FIG. 8, it is acceptable to have an arrangement in which, in a plan view to see from the heat releasing surface toward the opposing surface, the portion in which the inter-fin passages Rp are formed completely overlaps the inflow-side coolant reservoir Ri and the outflow-side coolant reservoir Ro. By positioning the inflow-side coolant reservoir Ri and the outflow-side coolant reservoir Ro in this manner, it is possible to provide the cooling structure 50 that has a compact configuration in terms of the width direction thereof.

(2) In the case where, as described above, both the inflow-side coolant reservoir Ri and the outflow-side coolant reservoir Ro are configured so as to be able to cool down the cooling target (i.e., the electric motor 1) that is different from the heating target (i.e., the inverter 3), it is desirable to have an arrangement in which the level of cooling performance of the outflow-side coolant reservoir Ro to cool down the cooling target is higher than the level of cooling performance of the inflow-side coolant reservoir Ri to cool down the cooling target. With this arrangement, it is possible to suppress the cooling of the cooling target by the inflow-side coolant reservoir Ri. As a result, it is possible to suppress the temperature of the coolant in the inflow-side coolant reservoir Ri from increasing. Consequently, it is possible to prevent the cooling efficiency for cooling down the heating target from being lowered.

More specifically, for example, as shown in FIG. 8, the number of fins 21 that protrude from the drive unit case 2 into the outflow-side coolant reservoir Ro may be set larger than the number of fins 21 that protrude from the drive unit case 2 into the inflow-side coolant reservoir Ri. By setting the number of fins 21 in this manner, it is possible to ensure that the heat transfer area between the outflow-side coolant reservoir Ro and the drive unit case 2 is larger than the heat transfer area between the inflow-side coolant reservoir Ri and the drive unit case 2. As a result, the level of cooling performance of the outflow-side coolant reservoir Ro to cool down the cooling target is set higher than the level of cooling performance of the inflow-side coolant reservoir Ri to cool down the cooling target.

Figure 9:
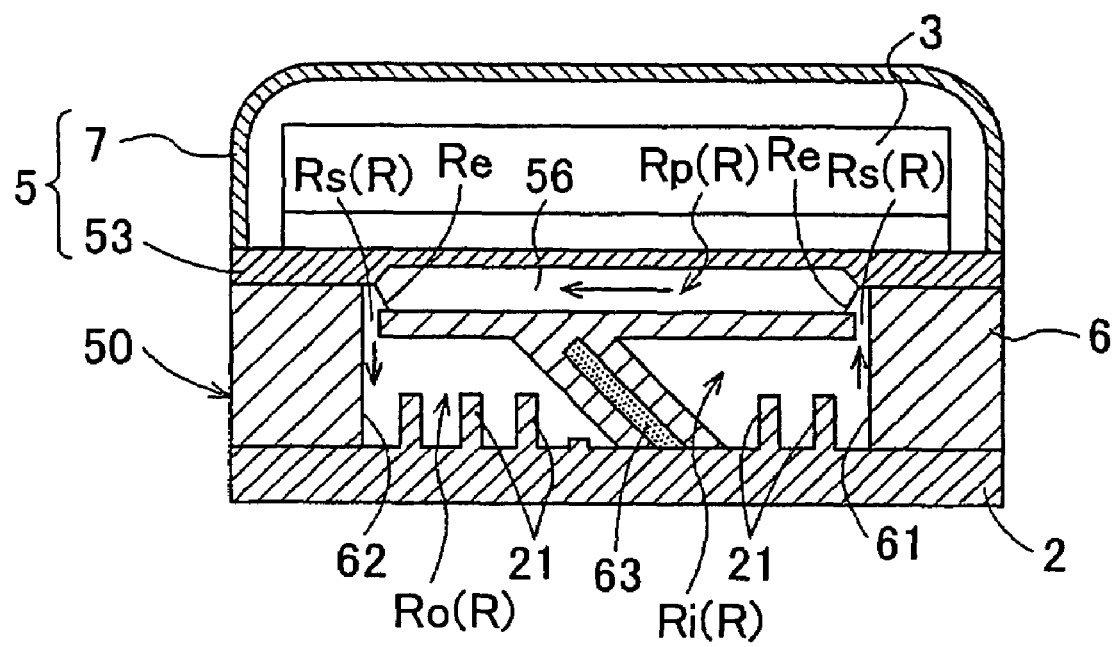
FIG. 9 is a cross-sectional view that shows the state of a coolant space according to yet another embodiment.

Further, for example, as shown in FIG. 9, the area of the upper face of the drive unit case 2 that is in contact with the coolant in the outflow-side coolant reservoir Ro is set larger than the area of the upper face of the drive unit case 2 that is in contact with the coolant in the inflow-side coolant reservoir Ri, and also the number of fins 21 in the outflow-side coolant reservoir Ro is set larger than the number of fins 21 in the inflow-side coolant reservoir Ri. With this arrangement also, the heat transfer area between the outflow-side coolant reservoir Ro and the drive unit case 2 is larger than the heat transfer area between the inflow-side coolant reservoir Ri and the drive unit case 2. As a result, the level of cooling performance of the outflow-side coolant reservoir Ro to cool down the cooling target is set higher.

(3) In the embodiment described above, the example is explained in which both the inflow-side coolant reservoir Ri and the outflow-side coolant reservoir Ro are thermally connected to the electric motor 1 so as to be able to cool down the electric motor 1. However, it is acceptable to have another arrangement in which only one of the inflow-side coolant reservoir Ri and the outflow-side coolant reservoir Ro is configured so as to be able to cool down the electric motor 1. In this situation, the other of the coolant reservoirs may be positioned so as not to be thermally connected to the electric motor 1. For example, the other coolant reservoir may be positioned on the upper face of the drive unit case 2, while a heat-insulating member is interposed there between, or may be positioned so as to have a distance from the drive unit case 2.

Further, another arrangement is acceptable in which neither the inflow-side coolant reservoir Ri nor the outflow-side coolant reservoir Ro is thermally connected to the electric motor 1, so that the electric motor 1 is not cooled down by either the inflow-side coolant reservoir Ri or the outflow-side coolant reservoir Ro.

(4) Further, with the embodiment described above, it is acceptable to have an arrangement in which a heat insulating unit 63 is provided between the inflow-side coolant reservoir Ri and the outflow-side coolant reservoir Ro, as shown in FIGS. 8 and 9. With this arrangement, it is possible to prevent the temperature of the coolant in the inflow-side coolant reservoir Ri from being increased by a heat transfer from the outflow-side coolant reservoir Ro to the inflow-side coolant reservoir Ri. As a result, it is possible to make the cooling efficiency even higher.

(5) In the embodiment described above, the inflow-side coolant reservoir Ri and the inflow-side port 51 are positioned in such a manner that the direction in which the inflow-side coolant reservoir Ri extends matches the direction in which the inflow-side port 51 extends. However, the positional relationship between the inflow-side coolant reservoir Ri and the inflow-side port 51 is not limited to the example described in the embodiment. It is acceptable to modify the positional relationship as necessary. For example, it is acceptable to have another arrangement in which the inflow-side port 51 is provided in a direction that is perpendicular to the direction in which the inflow-side coolant reservoir Ri extends or the inflow-side port 51 is provided from above or from below the inflow-side coolant reservoir Ri.

Also, as explained in the embodiment described above, it is desirable to arrange the positional relationship between the inflow-side port 51 and the narrowed portion Rs so that the opening of the inflow-side port 51 and the opening of the narrowed portion Rs do not oppose each other. However, the positional relationship does not necessarily have to be arranged in this manner. Even when the opening of the inflow-side port 51 and the opening of the narrowed portion Rs are arranged so as to oppose each other, because the flowing resistance at the narrowed portion Rs is arranged to be larger than the flowing resistance at the inflow-side coolant reservoir Ri, the coolant spreads throughout the entire length for which the inflow-side coolant reservoir Ri extends. Thus, it is possible to make substantially uniform the amount of coolant that flows into the inter-fin passages Rp.

Although the positional relationship between the inflow-side port 51 and the narrowed portion Rs is explained above as one example, it is possible to apply the same to the positional relationship between the outflow-side port 52 and the narrowed portion Rs.

As explained above, regardless of the positions in which the inflow-side port 51 and the outflow-side port 52 are provided, it is possible to keep uniform the flow state of the coolant flowing through the inter-fin passages Rp. Thus, depending on the positional situation of the cooling structure 50 to be installed, it is possible to determine, as necessary, the positions in which the inflow-side port 51 and the outflow-side port 52 are provided. Consequently, the degree of freedom in designing the device is increased.

(6) In the embodiment described above, the example is explained in which the inflow-side coolant reservoir Ri and the narrowed portion Rs on the inflow side, as well as the outflow-side coolant reservoir Ro and the narrowed portion Rs on the outflow side are provided. However, it is not necessary to provide the outflow-side coolant reservoir Ro and the narrowed portion Rs on the outflow side. It is acceptable to modify the configuration, as necessary. For example, it is acceptable to use a configuration in which the outflow-side coolant reservoir Ro and the narrowed portion Rs on the outflow side are not provided or a configuration in which the inter-fin passages Rp are connected to the outflow-side coolant reservoir Ro so as to allow communication there between, without having the narrowed portion Rs there between.

Further, with regard to the relationship between the reduction of area of the narrowed portion Rs on the inflow side and the reduction of area of the narrowed portion Rs on the outflow side, it is possible to ensure that the coolant flows smoothly by setting the reduction of area of the narrowed portion Rs on the outflow side to be less than the reduction of area of the narrowed portion Rs on the inflow side.

(7) In the embodiment described above, the example is explained in which the cooling structure 50 is configured by placing the spacer 6 and the heat sink 53 on the upper face of the drive unit case 2. However, the present invention is not limited to this example, and other configurations are also acceptable. For example, it is acceptable to integrally form the cooling structure 50 with the other elements.

(8) In the embodiment described above, the heat releasing fins 56 are formed so as to stand from the heat releasing surface 53a by cutting and raising the heat releasing surface 53a of the heat sink 53. However, it is acceptable to form the heat releasing fins by using other methods. For example, it is acceptable to weld heat-releasing fins that have separately been manufactured onto the heat-releasing surface. Alternatively, it is also acceptable to integrally form the heat releasing fins together with the heat sink by using a mold.

(9) In the embodiment described above, the cooling structure 50 is configured so as to thermally protect the heat generating members by releasing, into the coolant, the heat generated by the heat generating members such as the inverter 3 and the electric motor 1 that are included in the drive unit. However, it is acceptable to have another arrangement in which the cooling structure is configured such that the heat that has been generated by an inverter or other electronic parts in another device is released into the coolant.

The heat generating member cooling structure and the drive unit according to the present invention can be effectively used as a heat generating member cooling structure that has a high level of heat releasing performance and a drive unit that includes such a heat generating member cooling structure and is therefore able to serve as a device that is compact and energy-saving.

In the heat generating member cooling structure according to a first aspect of the present invention, the coolant that has flowed into the inflow-side coolant reservoir flows into the inter-fin passages via the narrowed portion. In this situation, the narrowed portion is provided to extend at least throughout the area in which the inter-fin passages are arranged in a row and has a flowing resistance that is larger than the flowing resistance in the inflow-side coolant reservoir. Thus, after the coolant flows into the inflow-side coolant reservoir, the coolant is evenly distributed throughout substantially the entire of the inflow-side coolant reservoir in a direction in which the in-flow coolant reservoir extends. After that, the coolant flows into the inter-fin passages through the entire area of the narrowed portion. Thus, it is possible to have the coolant flow into the inter-fin passages in a substantially uniform manner.

As a result, the coolant flows through the inter-fin passages in a substantially uniform manner. Consequently, it is possible to efficiently cool down the heat generating member.

In the heat generating member cooling structure according to a second aspect of the present invention, the coolant that has flowed through the inter-fin passages flows out into the outflow-side coolant reservoir that is provided to extend in the direction in which the inter-fin passages are arranged in a row. In other words, the coolant from the inter-fin passages flows out into the outflow-side coolant reservoir that has a flowing resistance that is substantially uniform along the direction in which the outflow-side coolant reservoir extends. As a result, the coolant also flows out of the inter-fin passages in a substantially uniform manner.

Consequently, the coolant flows through the inter-fin passages in a more uniform manner, and the cooling efficiency becomes higher.

In the heat generating member cooling structure according to a third aspect of the present invention, because the inter-fin passages and the outflow-side coolant reservoir are joined together so as to allow communication there between by the narrowed portion that is provided to extend at least throughout the area in which the inter-fin passages are arranged in a row, it is possible to distribute an appropriate amount (not too much, not too little) of coolant in terms of the direction in which the narrowed portion extends. Also, the coolant that has flowed through the inter-fin passages flows out into the outflow-side coolant reservoir via the narrowed portion that has a flowing resistance that is larger than the flowing resistance in the outflow-side coolant reservoir. As a result, it is possible to have the coolant flow out of the inter-fin passages in a substantially uniform manner.

Consequently, the coolant flows through the inter-fin passages in a more uniform manner, and the cooling efficiency for cooling down the heat generating member becomes even higher.

Further, by providing the narrowed portion on the inflow side and the narrowed portion on the outflow side and balancing these narrowed portions, it is possible to appropriately control the flow of the coolant that flows through the inter-fin passages.

In the heat generating member cooling structure according to a fourth aspect of the present invention, because at least one of the inflow-side coolant reservoir and the outflow-side coolant reservoir functions as the cooling unit that cools down a cooling target that is different from the heat generating member, there is no need to provide a separate cooling unit in order to cool down the cooling target. Further, even when a separate cooling unit is provided, it is possible to lower the level of cooling performance that is required. As a result, it is possible to make the device smaller and reduce the cost.

In the heat generating member cooling structure according to a fifth aspect of the present invention, when the portion in which the inter-fin passages are formed, the inflow-side coolant reservoir and the outflow-side coolant reservoir are positioned in such a manner, such that it is possible to make the cooling structure smaller in terms of the width direction thereof.

In the heat generating member cooling structure according to a sixth aspect of the present invention, when the portion in which the inter-fin passages are formed, the inflow-side coolant reservoir and the outflow-side coolant reservoir are positioned in such a manner, such that it is possible to make the cooling structure smaller in terms of the height direction thereof.

Generally speaking, the temperature of coolant that flows out into the outflow-side coolant reservoir after exchanging heat with a heat generating object is higher than the temperature of coolant that flows into the inflow-side coolant reservoir before exchanging heat with the heat generating object. Thus, with the arrangement in the heat generating member cooling structure according to a seventh aspect of the present invention where a heat insulating unit is provided between the inflow-side coolant reservoir and the outflow-side coolant reservoir, it is possible to prevent the temperature of the coolant in the inflow-side coolant reservoir from being increased by a heat transfer from the outflow-side coolant reservoir to the inflow-side coolant reservoir. Consequently, it is possible to make the cooling efficiency for cooling down the heat generating member even higher.

In the heat generating member cooling structure according to an eighth aspect of the present invention where the level of cooling performance of the outflow-side coolant reservoir to cool down the cooling target is set to be higher than the level of cooling performance of the inflow-side coolant reservoir to cool down the cooling target, it is possible to suppress the cooling of the cooling target by the inflow-side coolant reservoir. As a result, it is possible to inhibit the temperature of the coolant in the inflow-side coolant reservoir from increasing. Thus, it is possible to prevent the cooling efficiency for cooling down the heat generating member from being lowered, while the other cooling target is being cooled.

In the heat generating member cooling structure according to a ninth aspect of the present invention in which the inflow portion to the inter-fin passages is inclined with respect to the direction in which the heat releasing fins stand, it is possible to make the flowing area of the inflow portion larger than in the case where the inflow portion is perpendicular to the direction in which the heat releasing fins stand. As a result, it is possible to reduce the flowing resistance at the inflow portion to the inter-fin passages. Thus, it is possible to have the coolant flow through the inter-fin passages properly. Consequently, it is possible to make the cooling efficiency for cooling down the heat generating member even higher.

With the drive unit according to a tenth aspect of the present invention, even when the drive unit that has the electric motor built therein is integrally formed with the inverter, one of the heat generating member cooling structures explained above according to the present invention is included in the drive unit, while the inverter is used as the heat generating member. Thus, the drive unit is able to achieve the same characteristic configurations as the characteristic configurations of the heat generating member cooling structure. Consequently, it is possible to properly release the heat from the inverter and to thermally protect the inverter.

With the drive unit according to an eleventh aspect of the present invention, because the drive unit case is thermally connected to the heat releasing surface, it is possible to properly release the heat generated by the electric motor and the like within the drive unit case to the coolant side via the heat releasing surface.

In addition, in the case where the drive unit case is thermally connected to the heat releasing surface as described above, by having the edge portion of each of the heat releasing fins abuts against the opposing surface, it is possible to improve the level of heat releasing performance from the heat releasing surface to the coolant side.

What is claimed is:

1. A heat generating member cooling structure in which a coolant space is formed between a heat releasing surface that is thermally connected to a heat generating member and an opposing surface that is positioned opposite the heat releasing surface, comprising:
   a plurality of heat releasing fins that are provided within the coolant space so as to be parallel to one another and stand from the heat releasing surface toward the opposing surface, and
   an inter-fin passage, through which a coolant flows, formed between every two of the plurality of heat releasing fins that are positioned adjacent to each other, wherein:
     the heat generating member cooling structure comprises an inflow-side coolant reservoir that extends in a direction in which inter-fin passages are arranged in a row with the inflow-side coolant reservoir connected to ends of the inter-fin passages on a first side so as to allow communication there between,
     the inter-fin passages and the inflow-side coolant reservoir are joined together so as to allow communication there between by a narrowed portion that extends at least throughout an area in which the inter-fin passages are arranged in the row, and the narrowed portion has a flowing resistance that is larger than a flowing resistance in the inflow-side coolant reservoir.

2. The heat generating member cooling structure according to claim 1, further comprising:
an outflow-side coolant reservoir that extends in the direction in which the inter-fin passages are arranged in the row with the outflow-side coolant reservoir connected to ends of the inter-fin passages on a second side so as to allow communication there between.

3. The heat generating member cooling structure according to claim 2, wherein:
the inter-fin passages and the outflow-side coolant reservoir are joined together so as to allow communication there between by a narrowed portion that extends at least throughout the area in which the inter-fin passages are arranged in the row, and
the narrowed portion has a flowing resistance that is larger than a flowing resistance in the outflow-side coolant reservoir.

4. The heat generating member cooling structure according to claim 2, wherein at least one of the inflow-side coolant reservoir and the outflow-side coolant reservoir functions as a cooling unit that cools down a cooling target that is different from the heat generating member.

5. The heat generating member cooling structure according to claim 4, wherein:
both the inflow-side coolant reservoir and the outflow-side coolant reservoir are configured so as to be able to cool down the cooling target, and
a level of cooling performance of the outflow-side coolant reservoir to cool down the cooling target is set to be higher than a level of cooling performance of the inflow-side coolant reservoir to cool down the cooling target.

6. The heat generating member cooling structure according to claim 2, wherein in a plan view from the heat releasing surface toward the opposing surface, a portion in which the inter-fin passages are formed overlaps at least one of the inflow-side coolant reservoir and the outflow-side coolant reservoir.

7. The heat generating member cooling structure according to claim 2, wherein the inflow-side coolant reservoir and the outflow-side coolant reservoir are positioned on a plane that is the same as a plane on which a portion in which the inter-fin passages are formed is positioned.

8. The heat generating member cooling structure according to claim 4, wherein a heat insulating unit is provided between the inflow-side coolant reservoir and the outflow-side coolant reservoir.

9. The heat generating member cooling structure according to claim 1, wherein
the heat releasing fins are formed such that a length of each of the heat releasing fins in an edge portion thereof is different from a length in a base end portion thereof in terms of a direction in which the inter-fin passages are formed, and an inclined inflow portion is provided on an end of each of the heat releasing fins in the direction in which the heat releasing fins are formed, the inclined inflow portion having an end face that is inclined with respect to a direction in which the heat releasing fins stand.

10. The heat generating member cooling structure according to claim 1, wherein the inter-fin passages extend in a direction that is substantially perpendicular to a direction in which the inflow-side coolant reservoir extends.

11. The heat generating member cooling structure according to claim 1, wherein a width of the narrowed portion is substantially the same along a length of the narrowed portion.

12. The heat generating member cooling structure according to claim 1, wherein the inflow-side coolant reservoir is positioned below the inter-fin passages.

13. The heat generating member cooling structure according to claim 2, wherein at least one of the inflow-side coolant reservoir and the outflow-side coolant reservoir is positioned below the inter-fin passages.

14. The heat generating member cooling structure according to claim 1, wherein the narrowed portion is above the inflow-side coolant reservoir.

15. The heat generating member cooling structure according to claim 2, wherein narrowed portion is above at least one of the inflow-side coolant reservoir and the outflow-side coolant reservoir.

16. The heat generating member cooling structure according to claim 1, wherein a direction in which the coolant flows from an inflow-side port into the inflow-side coolant reservoir does not overlap a direction in which the coolant flows out of the inflow-side coolant reservoir into the narrowed portion.

17. The heat generating member cooling structure according to claim 2, wherein a direction in which the coolant flows from the outflow-side coolant reservoir into an outflow-side port does not overlap a direction in which the coolant flows out of the narrowed portion into the outflow-side coolant reservoir.

18. The heat generating member cooling structure according to claim 1, wherein the inflow-side coolant reservoir is positioned on a same plane as the inter-fin passages.

19. A drive unit comprising:
an electric motor;
a drive unit case that houses the electric motor therein;
an inverter that controls the electric motor; and
the heat generating member cooling structure according to claim 1, wherein the inverter is the heat generating member.

20. The drive unit according to claim 19, wherein:
the drive unit case is positioned on the opposing surface side with respect to the heat releasing surface, and
the drive unit case is thermally connected to the opposing surface.

* * * * *